United States Patent
Ayyagari et al.

(10) Patent No.: US 7,015,850 B2
(45) Date of Patent: Mar. 21, 2006

(54) BANDWIDTH LIMITED SAMPLING CIRCUIT OF HIGH LINEARITY

(75) Inventors: Ravishankar S. Ayyagari, Bangalore (IN); Visvesvaraya A. Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/710,620

(22) Filed: Jul. 26, 2004

(65) Prior Publication Data

US 2005/0046605 A1   Mar. 3, 2005

Related U.S. Application Data

(60) Provisional application No. 60/498,801, filed on Aug. 29, 2003.

(51) Int. Cl.
*H03M 1/12*   (2006.01)
(52) U.S. Cl. .................. 341/155; 341/172; 341/143
(58) Field of Classification Search ............... 341/155, 341/144, 143, 172, 139, 122
See application file for complete search history.

(56) References Cited

U.S. PATENT DOCUMENTS

| | | | | |
|---|---|---|---|---|
| 4,560,963 A | * | 12/1985 | Sharpe | 333/172 |
| 4,574,250 A | * | 3/1986 | Senderowicz | 330/258 |
| 4,581,765 A | * | 4/1986 | Stec | 380/32 |
| 4,633,425 A | * | 12/1986 | Senderowicz | 708/819 |
| 5,909,131 A | * | 6/1999 | Singer et al. | 327/91 |
| 2002/0163981 A1 | * | 11/2002 | Troemel, Jr. | 375/345 |
| 2004/0032628 A1 | * | 2/2004 | Sato et al. | 358/514 |

\* cited by examiner

*Primary Examiner*—Peguy JeanPierre
(74) *Attorney, Agent, or Firm*—W. Daniel Swayze, Jr.; W. James Brady; Frederick J. Telecky, Jr.

(57) ABSTRACT

A bandwidth limited sampling circuit of high linearity may be implemented by using a first circuit portion to limit the bandwidth of the input signals, and using a second circuit portion to sample the bandwidth limited input signal. The first circuit portion and the second circuit portion may be implemented using separate components. In an alternative embodiment, bandwidth limiting is implemented by taking a difference of a sampled input signal from a sampled high frequency components of the input signal.

39 Claims, 5 Drawing Sheets

BANDWIDTH LIMITED SAMPLING CIRCUIT OF HIGH LINEARITY

CROSS REFERENCE TO RELATED APPLICATIONS

The present application is related to and claims priority from co_pending U.S. provisional patent application entitled, "Noise Suppression Scheme for Sampling Circuit", Filed on: Aug. 29, 2003, Ser. No. 60/498,801, naming as inventors: AYYAGARI et al, and is incorporated in its entirety herewith into the present application.

BACKGROUND OF INVENTION

1. Field of the Invention

The present invention relates to the design of electrical/electronic circuits, and more specifically to a method and apparatus for attaining a bandwidth limited sampling circuit of high linearity.

2. Related Art

A sampling circuit generally refers to a component which samples a signal level of an input signal (e.g., analog signal) at a particular instant of time and provides an output signal having the signal level to other components for a long duration. In general, a sampling circuit samples an input analog signal at a time point specified by a clock signal, and provides an output signal with the sampled strength to other components for further processing for a long time.

An input signal generally contains a source signal and a noise signal/component. It is generally desirable that the sampled output generated by a sampling circuit contain only the source signal component, which is generally referred to as providing a high signal to noise ratio (SNR).

A prior approach may remove the noise component by eliminating high frequency components from an input signal as the noise component is generally present at high frequencies. One problem with such an approach is that some of the components performing such removal may have non_linear characteristics, which results in a non_linear response in terms of the overall sampling operation. The non_linearity is undesirable in several environments. Accordingly, what is needed is a bandwidth limited sampling circuit of high linearity providing high SNR.

BRIEF DESCRIPTION OF DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A sampling circuit implemented according to one aspect of the present invention contains a first circuit portion which limits the bandwidth of an input signal containing both source signal and a noise signal, and a second circuit portion samples the bandwidth limited signal. Noise signal, which is generally of high frequency, is substantially absent at an output of the sampling circuit due to the operation of the first circuit portion. As a result, the immunity of the output signal generated by the sampling circuit to noise is enhanced. In one embodiment described below, the first circuit portion is implemented as a R_C circuit operating as a low pass filter, and the second circuit portion is implemented using a switched capacitor.

According to another aspect of the present invention, the sampling circuit is implemented using two paths, with the first circuit path sampling the input signal (including source signal and noise signal) and the second circuit path sampling only the high frequency components of the input signal. The sampled signal is generated as a difference of the signals sampled by the two paths. Due to the difference, any high frequency noise components are eliminated, thereby enhancing the immunity of the output signal of the sampling circuit to the noise in the input signal.

Various aspects of the present invention are described below with reference to an example problem. Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well_known structures or operations are not shown in detail to avoid obscuring the invention.

2. Example Environment

Figure 1:
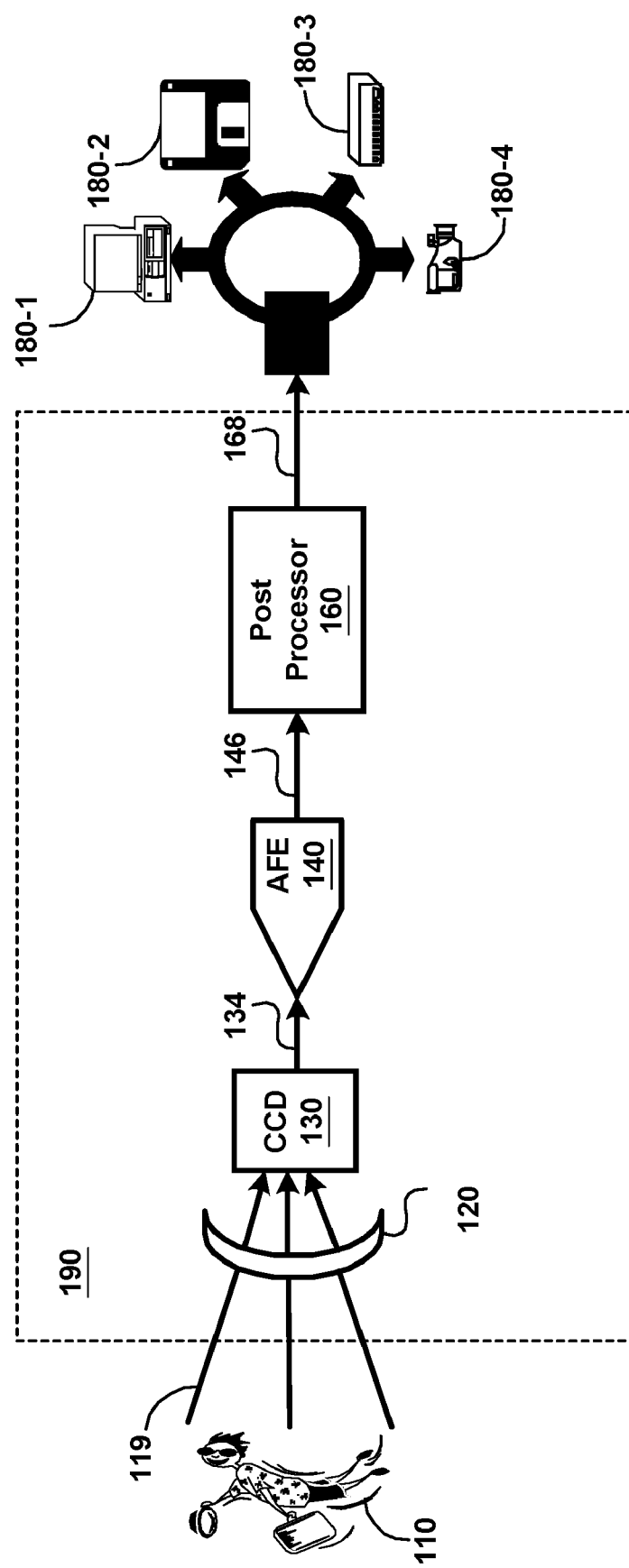
FIG. 1 is a block diagram illustrating an example environment in which the present invention may be implemented.

FIG. 1 is a block diagram illustrating an example environment in which the present invention can be implemented. Light 119 emanating from image 110 is shown being passed to device 190 (such as a digital camera or a scanner). Device 190 generates pixel data elements representing image 110. The pixel data elements may be forwarded on path 168, and used in several ways, for example, viewed/edited by computer system 180_1, stored in floppy disk 180_2, printed on printer 180_3 or transferred to video player 180_4.

Device 190 is shown containing lens 120, CCD (Charge Coupled Device) 130, analog front end (AFE) 140 and post processor 160. Light 119 from image 110 is shown being focused on CCD 130 by lens 120. CCD 130 contains several pixels which are charged proportionate to the product of the intensity of the incident light and the time of exposure to the light. The charge (example of an electrical signal) is converted into voltage in a known way and transferred to AFE 140 on path 134.

AFE 140 converts an input signal received on path 134 into digital values (on path 146) representing the image, and transmits the digital values to post processor 150. Input signal on path 134 may contain a source signal representing the voltages and an unwanted noise signal. AFE 140 may employ techniques such as correlated double sampling (which are well known in the relevant arts) in the course of generating the digital values while substantially eliminating the noise signal in the digital values in accordance with several aspects of the present invention as described below in further detail.

Post processor 160 (example of a processor) processes the digital values received on path 146, generally to enhance the quality of image represented by the digital values and/or to convert the data into suitable format for storing. The resulting output data on path 168 may be used in several ways by one of the external devices, for example, stored in a memory for processing later. The description is continued with reference to the details of example embodiment of AFE 140.

3. Analog Front End

Figure 2:
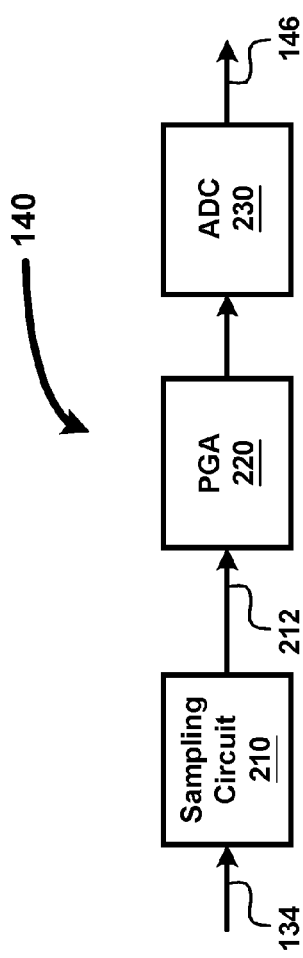
FIG. 2 is a block diagram of an analog front end illustrating the details (in one embodiment) as relevant to an understanding of several aspects of the present invention.

FIG. 2 is a block diagram of AFE 140 illustrating the details (in one embodiment) as relevant to an understanding of several aspects of the present invention. AFE 140 is shown containing sampling circuit 210, programmable gain amplifier (PGA) 220 and analog to digital converter (ADC) 230. Each component is described below in further detail.

Sampling circuit 210 samples the voltage levels on a source signal received on path 134 according to various aspects of the present invention to generate an output voltage level which is (substantially) immune from any noise also received on path 134. Sampling circuit 210 may further perform operations such as correlated double sampling (CDS) to generate a voltage level corresponding to a pixel of image 110.

PGA 220 amplifies the voltage level received on path 212 by a gain specified typically by a designer depending on image 110. ADC 230 digitizes the amplified voltage signal to generate pixel digital elements on path 146 for further processing. PGA 220 and ADC 230 may be implemented in a known way.

The digital elements generated by ADC 230 may accurately reflect image 110 as sampling circuit 210 may be implemented to be immune to any noise present in the input signal received on path 134. Various aspects of the present invention will be clearer by first appreciating a prior approach, which may not include one or several features of the present invention. Accordingly, a prior approach is described below first.

4. Prior Sampling Circuit

Figure 3:
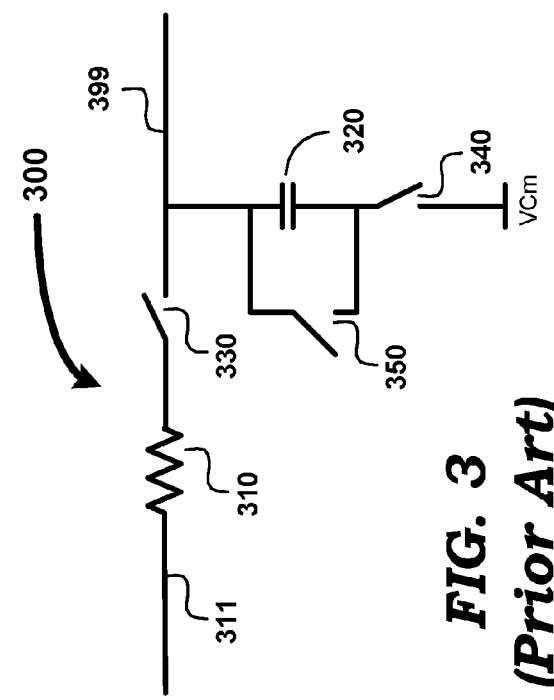
FIG. 3 is a circuit diagram illustrating the details of a sampling circuit in one prior embodiment.

FIG. 3 is a circuit diagram illustrating the details of a sampling circuit in one prior embodiment. Sampling circuit 300 is shown containing resistor 310, capacitor 320, and switches 330, 340 and 350. Each component is described below.

Resistor 310 receives input signal (includes both source signal and a noise signal) on path 311 and provides bandwidth limiting to the input signal, as described in further detail below. Capacitor 320 samples the input signal by charging to the voltage level of input signal when switches 330 and 340 are closed. The time (Ts) duration of sampling is controlled by controlling switches 330 and 340. The voltage across capacitor 320 at the end of sampling time, Ts, represents the sampled voltage level and is provided on path 399. Capacitor 320 discharges through switch 350 when in closed state for next sampling of input signal 311.

As is well known in relevant arts, resistor 310 and capacitor 320 together operate as a low pass filter, which limits the bandwidth of input signal 311. Due to the bandwidth limiting, any high frequency CCD noise signal components are removed from signal 311 and low frequency source signal components are provided on path 399. Bandwidth limiting may be achieved by choosing R_C (Rs and C320, wherein Rs is series resistance including resistance of resistor 310, and switches 330 and 340) time constant (Trc) of a desired value (as is well known in the relevant arts) to effectively reduce CCD noise signal components.

Thus, sampling circuit 300 samples source signal level received on path 311 at a time instant and provides the sampled voltage on path 399. In addition, sampling circuit 300 performs bandwidth limiting to reduce CCD noise signal components in the sampled output on path 399.

One potential problem with sampling circuit 300 is the signal at output may be degraded. The degradation may be caused as the voltage on path 399 may equal a fraction (much less than 1) of the voltage level of signal 311. The reason for such a fraction may be appreciated by understanding that the R_C time constant Trc equals the product of Rs and C320, and generally has a limited value. Due to the requirement that Trc to be greater than or equal to Ts/2, the value of Ts may also be small and capacitor 320 may charge to only a fraction of the voltage level 311 in time duration Ts. Thus, the image quality is diminished due to such partial charging.

The degradation of image quality in such a situation may be degraded by the non_linearity introduced by switch 330. At least in case of implementations using technologies such as CMOS transistors, the resistance of switch 330 varies with variation in voltage level of input signal 311. The variable resistance introduces non_linearity into the operation of sampling circuit 300 due to the partial charging. As a result, the image quality is diminished since the sampled output voltage level on path 399 is determined by R_C time constant Trc, which depends on variable resistance R310, thereby degrading the image quality. Various aspects of the present invention overcome some of such problems as described below in further detail.

5. Sampling Circuit

Figure 4:
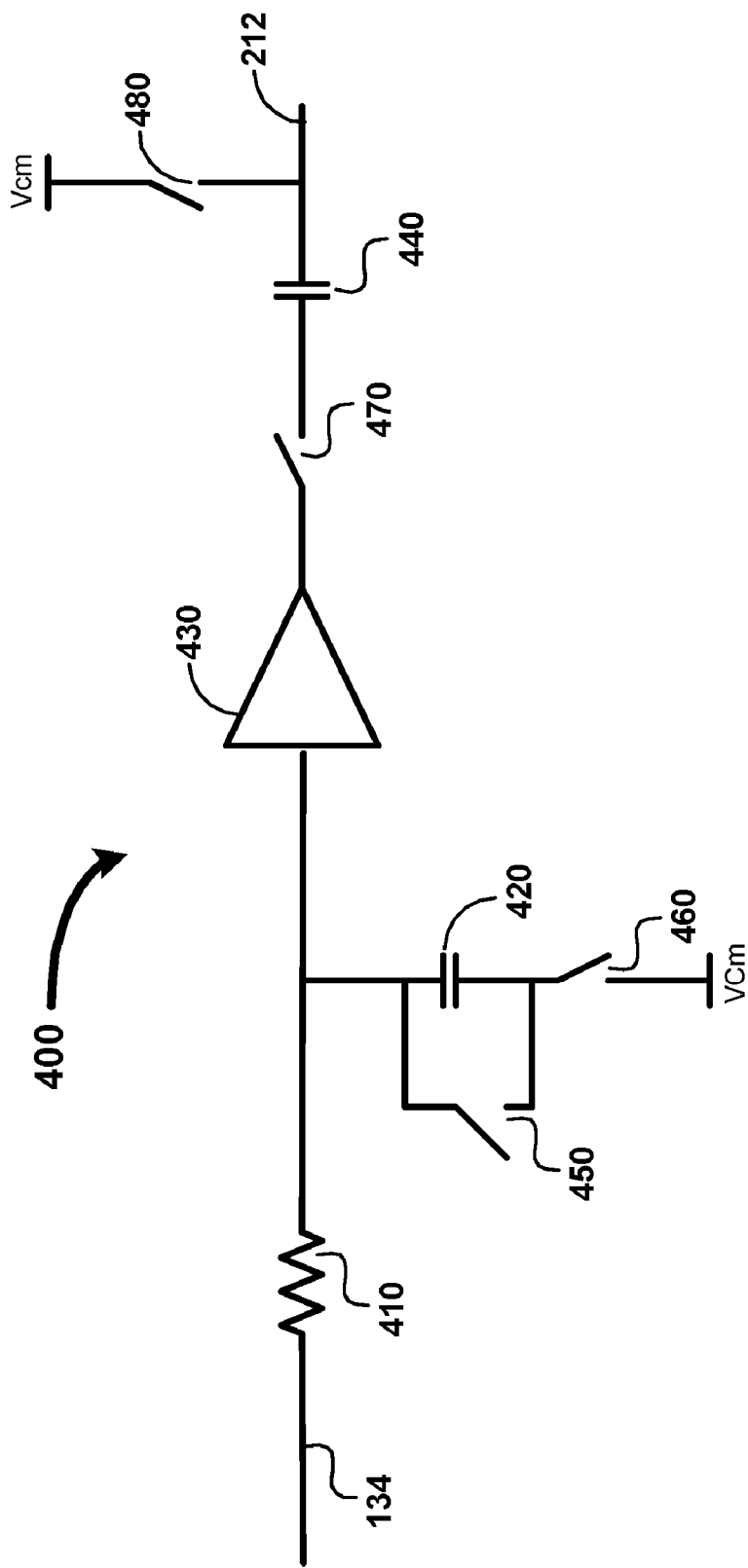
FIG. 4 is a circuit diagram illustrating the details of a sampling circuit in an embodiment of the present invention.

FIG. 4 is a circuit diagram illustrating the details of a sampling circuit in an embodiment of the present invention. Merely for illustration, sampling circuit 400 is described with reference to FIGS. 1 and 2, however, sampling circuit 400 can be implemented in other environments as well. Sampling circuit 400 is contained in sampling circuit 210 of FIG. 2. Sampling circuit 400 is shown containing resistor 410, capacitors 420 and 440, buffer 430, and switches 450, 460, 470 and 480. Each component is described below.

Broadly, a first circuit portion containing resistor 410, capacitor 420, and switches 450/460 performs bandwidth limiting and the second circuit portion containing capacitor 440, and switches 470/480 performs sampling. As may be apparent, the first circuit portion and second circuit portions are implemented using a separate set of components. Due to the use of two separate portions for bandwidth limiting and sampling respectively, sampling circuit 400 may be substantially immune to noise in the input signal received on path 134, while providing a linear response as described below.

Switches 450, 460, 470 and 480 are controlled by a clock signal (not shown). During one phase of the clock signal, switches 460, 470 and 480 are closed and switch 450 is opened to sample input signal on path 134. During another phase of the clock signal, switches 460, 470 and 480 are opened and switch 450 is closed to enable capacitor 420 to sample next signal on path 134. The manner in which bandwidth limiting may be performed is described below first, and then sampling is described later.

Resistor 410 receives input signal on path 134 and capacitor 420 charges to the voltage level of input signal 134 when switch 460 is in closed state. Capacitor 420 discharges through switch 450 when in closed state to sample the next signal level. Upper plate of capacitor 420 is connected to resistor 410 and lower plate of capacitor 420 is connected to a common mode voltage via switch 460.

Thus, the configuration of resistor 410 and capacitor 420 operates as a low pass filter, which limits the bandwidth by removing high frequency noise signal components and allowing only low frequency source signal components to be present across capacitor 420. The noise signal may be reduced effectively by selecting RC (R410 and C420) time constant to be large. The manner in which sampling may be performed is described below.

Capacitor 440, and switches 470 and 480 together sample the voltage level of source signal (which does not include noise signal) received on path 134. Capacitor 440 samples the voltage level stored on capacitor 420 when switches 470 and 480 are closed (switch 460 is also closed on the same time) and provides the sampled voltage level on path 212 when switches 470 and 480 are opened. However, switch 470 is opened before switch 460 is opened to avoid charge injection on capacitor 440.

Buffer 430 provides a low impedance drive to the second circuit portion, and thus allowing the required drive current to capacitor 440 to settle (substantially) completely (that is, charges to the sampled voltage level on capacitor 420). As a result, linearity of the sampled voltage level provided on path 212 may not be affected. If buffer 430 is not present, capacitor 440 loads capacitor 420 and thus causes the voltage across capacitor 420 to be reduced.

In comparison to the prior circuit described above with reference to FIG. 3, it may be noted that a non_linear switch, whose resistance value changes with input signal swing, is not present in input signal path. Even though switch 470 receives input signal 134 through buffer 430, the path in which switch 470 is present operates with a small time constant (due to absence of series resistance). Thus, the non_linearity of resistance of switch 470 may not affect the sampled output on path 212. As a result, non_linearity in the sampled output signal on path 212 may be negligibly small.

However, buffer 430 needs to be capable of receiving high bandwidth of the signal present at the output of capacitor 420. Buffer 430 may also need to have bandwidth greater than RC (R410×C420) time constant in order not to introduce error due to settling and phase shift as is well known in relevant arts. In addition, buffer 430 may need to be capable of receiving a voltage swing as large as the voltage swing in input signal 134 since voltage stored on capacitor 420 approximately equals input voltage 134 (Vi) as given by equation (1).

Voltage on capacitor 420=Vi (1_exp(_Ts/RC))  Equation (1) In an example embodiment, when RC time constant equals Ts/2 to reduce CCD noise, voltage on capacitor 420 equals 0.86 of input voltage 134 as given by equation (2) below.

Voltage on capacitor 420=Vi (1_exp(_2))=0.86 Vi  Equation (2) However, a fast buffer with high input signal swing leads to high power dissipation and is not desirable. In general, a source_follower buffer is very fast (high bandwidth) and consumes less power. However, the input swing capacity is less. Alternatively, a closed loop class_A buffer provides high bandwidth. However, such buffer introduces more noise and also requires more power. Therefore, an alternative embodiment may overcome some of such disadvantages as described below with reference to FIG. 5.

6. Alternative Embodiment

Figure 5:
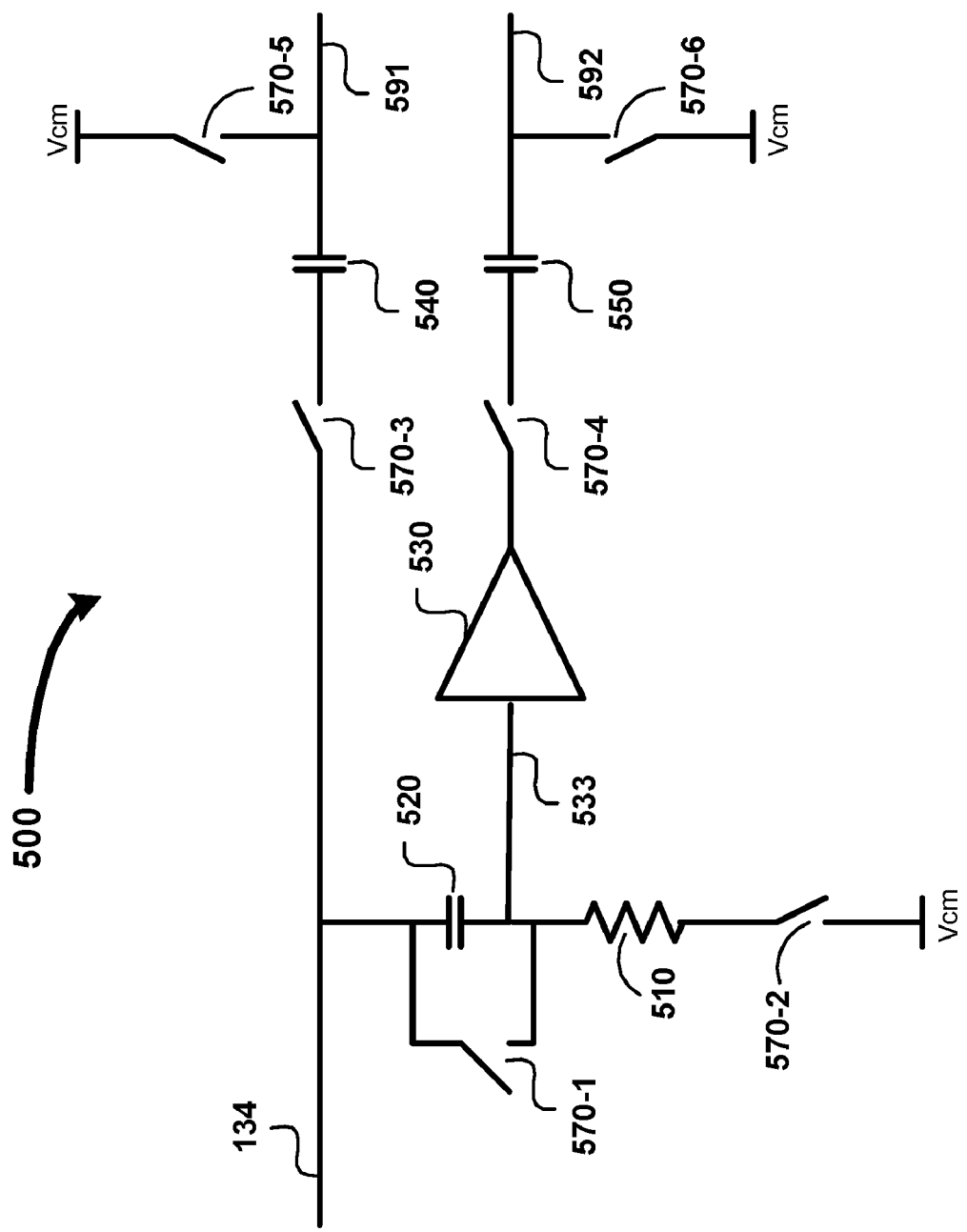
FIG. 5 is a circuit diagram illustrating the details of a sampling circuit in an alternative embodiment of the present invention.

FIG. 5 is a circuit diagram illustrating the details of a sampling circuit in an alternative embodiment of the present invention. Merely for illustration, sampling circuit 500 is described with reference to FIGS. 1 and 2, however, sampling circuit 500 can be implemented in other environments as well. Sampling circuit 500 is contained in sampling circuit 210 of FIG. 2. Sampling circuit 500 is shown containing resistor 510, capacitors 520, 540 and 550, buffer 530, and switches 570_1 through 570_6. Each component is described below.

Broadly, a first circuit path containing capacitor 540, and switches 570_3/570_5 samples the entire input signal (including both source signal and noise signal) received on path 134, and a second circuit path containing resistor 510, capacitors 520 and 550, buffer 530, and switches 570_1, 570_2, 570_4 and 570_6 samples only the high frequency components in input signal 134. The sampled output signal is generated as a difference of the signals sampled by the two paths 591 and 592. Due to the difference, the high frequency noise signal components received on path 134 may be eliminated and sampling circuit 500 may be substantially immune to noise in the input signal received on path 134, while providing a linear response as described below.

Switches 570_1 through 570_6 are controlled by a clock signal (not shown). During one phase of the clock signal, switches 570_2 through 570_6 are closed and switch 570_1 is opened to sample input signal on path 134. During another phase of the clock signal, switches 570_2 through 570_6 are opened and switch 570_1 is closed to enable capacitor 520 to sample next signal on path 134. The manner in which bandwidth limiting and sampling may be performed is described below.

Resistor 510, capacitor 520, and switches 570_2 and 570_1 together operate as a high pass filter as would be apparent to one skilled in the relevant art. The high pass filter filters the low frequency components in the input signal received on path 134 and provides the remaining high frequency components on path 533.

Buffer 530, capacitor 550, and switches 570_4 and 570_6 operate similar to buffer 430, capacitor 440, and switches 470 and 480 of FIG. 4 respectively. Thus, capacitor 550 samples the output of the high pass filter on path 533 when switches 570_4 and 570_6 are closed and provides the sampled output on path 592 when switches 570_4 and 570_6 are opened.

Capacitor 540 samples all frequencies of input signal received on path 134, including both the source signal and the high frequency noise components, when switches 570_3 and 570_5 are closed and provides the sampled output on path 591 when switches 570_3 and 570_5 are opened. The sampled output on path 591 contains all the frequency components in signal 134 and the output on path 592 contains only high frequency components. Therefore, the difference of outputs on paths 591 and 592 contains the sampled output with only low frequency source signal components and thus removes high frequency CCD noise components as desirable. Paths 591 and 592 are contained in path 212 of FIG. 2.

As described above with equation (2) in the above illustrative example, voltage across capacitor 520 equals 0.86 Vi when RC (R510 and C520) time constant is Ts/2. As a result, the remaining voltage 0.14 Vi is present across resistor 510, which is the input voltage to buffer 530 on path 533. Therefore, buffer 530 may need to be capable of receiving only 14% of the swing in input voltage (Vi). As a result of the small voltage swing at the input of buffer, the power dissipation is low. Due to the small input voltage swing, a source follower buffer may be used as buffer 530. In general, a source follower has high bandwidth and thus speed of operation is also high. The manner in which the approaches of FIG. 5 can be used to implement correlated double sampling, is described below.

7. Correlated Double Sampler

Figure 6:
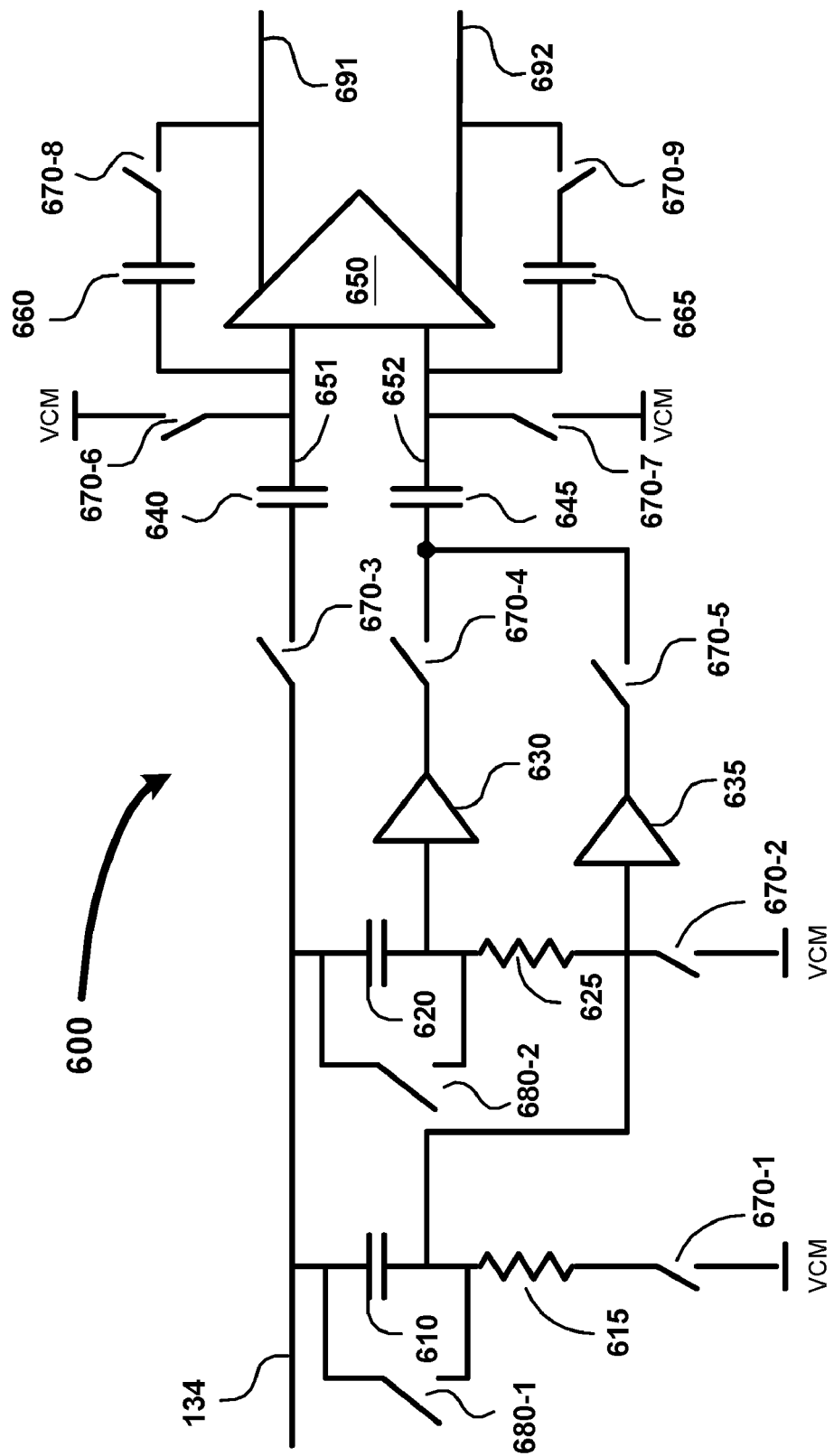
FIG. 6 is a circuit diagram illustrating the details of a correlated double sampler (CDS) used as a sampling circuit in a CCD sensor in one embodiment.

FIG. 6 is a circuit diagram illustrating the details of a correlated double sampler (CDS) used as sampling circuit 210 in CCD environments in one embodiment. CDS 600 is shown containing resistors 615 and 625, capacitors 610, 620, 640, 645, 660 and 665, and switches 670-1 through 670-9, 680-1 and 680-2.

In an embodiment, input signal received on path 134 contains reference level and relative video level, which are multiplexed in time domain. Thus, the reference level and the relative video level form the source signal in the corresponding time domain, and the input signal on path 134 contains noise signal in addition to the source signal. The actual video level may be obtained by subtracting relative video level from the reference level, as is well known in the relevant arts. The manner in which CDS 600 generates a sample representing the actual video level is described below.

Broadly, CDS 600 samples reference level during one phase (phase I) of clock signal and relative video level during another phase (phase II) of clock signal, and provides the actual video level between output paths 691 and 692. Paths 691 and 692 are contained in path 212 of FIG. 2. CDS 600 may implement the approaches described above with respect to sampling circuit 500 to sample both reference level and relative video level as described below in detail.

Such a sampling operation is supported by appropriately closing and opening various switches during different phases. Thus, all the shown switches in CDS 600 may be controlled by a clock signal (not shown). Switches 680_1 and 680_2 are closed to discharge capacitors 610 and 620 respectively prior to sampling input signal 134 and generating an actual video level. The manner in which actual video level may be generated from input signal 134 while substantially eliminating noise signal is described in further detail below.

During phase I, a first circuit path containing capacitor 640, and switches 670_3 and 670_6 passes input signal received on path 134 onto capacitor 640, the other end of which is held at a constant voltage by switch 670_6. The passed signal represents all frequency components of (reference level+high frequency noise).

A second circuit path containing resistor 625, capacitors 620 and 645, buffer 630, and switches 670_2, 670_4, and 670_7 passes input signal received on path 134 onto capacitor 645 after filtering it through the high_pass filter formed by resistor 625 and capacitor 620. The other end of capacitor 645 is held at a constant voltage by closing switch 670_7, while the second circuit path passes the input signal.

At the end of phase I, switches 670_6 and 670_7 are opened. As a result, the difference in voltages across capacitors 640 and 645, which is of (all frequency components_high frequency components) represents the low frequency component of input signal 134. Thus, the low frequency reference level (with the high_frequency noise removed) sampled across capacitors 640 and 645 differentially may be obtained.

During phase II, input signal 134 contains a reference video level, and the first circuit path passes input signal 134 onto capacitor 640. The passed signal represents all frequency components of (reference video level+high frequency noise). A third circuit path containing resistor 615, capacitors 610 and 645, buffer 635, and switches 670_1, 670_5, and 670_7 passes input signal received on path 134 after filtering it through the high_pass filter formed by resistor 615 and capacitor 610, onto capacitor 645.

It may be noted that switches 670_6 and 670_7 are opened during phase II, thus the other end of capacitors 640 and 645 is not held at a constant voltage, rather connected to the virtual ground of amplifier 650, which is in amplification mode. As a result, capacitors 640 and 645 still hold the sampled reference level during phase I across them. In addition, as capacitors 640 and 645 would be present in series with the filtered relative video level during phase II, the voltage at the output of amplifier 650 represents (low-_frequency filtered relative video level sampled in phase II−low_frequency filtered reference level stored on capacitors 640 and 645 in phase I), which in turn represents low_frequency actual video level with noise components removed.

Amplifier 650 amplifies the difference on paths 651 and 652 at the end of phase II due to the feedback paths formed by capacitors 660 and 665. The feed back paths are formed by capacitors 660 and 665 since switches 670_8 and 670_9 are closed during phase II. Due to charge sharing between capacitors 640 and 660 and also between capacitors 645 and 665, the difference is amplified and available for further processing on paths 691 and 692.

Thus, the difference signal between paths 691 and 692 represents the actual video level containing only low frequency components. Due to the bandwidth limiting, the output may be substantially independent of noise. In addition, linearity of response is maintained/enhanced by using various other features of the present invention.

8. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A sampling circuit to sample a source signal received on an input path, a noise signal of high frequency components also being received on said input path, said sampling circuit comprising:

a first circuit portion receiving an input signal on said input path, said input signal containing both of said source signal and said noise signal, said first circuit portion generating an output signal by limiting bandwidth of said input signal, wherein said noise signal being substantially absent in said output signal due to said limiting; and a second circuit portion sampling said output signal generated by said first circuit portion, wherein said first circuit portion comprises a low pass filter, wherein said second circuit portion is implemented as a switched capacitor circuit, wherein said low pass filter comprises:

a resistor receiving said source signal on one terminal and other terminal of said resistor being connected to a first node; and a first capacitor connected between said first node and a second node, wherein said first circuit portion further comprises:

a first switch connected between said second node and a common mode voltage; and a second switch connected across said first capacitor, and wherein said second circuit portion comprises:
a buffer being coupled to receive an input from said first node;
a second capacitor connected between a third node and a fourth node;
a third switch connected between an output of said buffer and said third node; and
a fourth switch connected between said fourth node and said common mode voltage.

2. The sampling circuit of claim 1, wherein said sampling circuit is implemented without requiring a bandwidth limiting element in signal path.

3. The sampling circuit of claim 1, wherein said second circuit portion and said first circuit portion are implemented using a separate set of components.

4. A sampling circuit to sample a source signal received on an input path, a noise signal of high frequency components also being received on said input path, said sampling circuit comprising:
a first circuit path sampling an input signal containing both of said source signal and said noise signal; and
a second circuit path sampling high frequency components of said input signal, wherein a difference of outputs of said first circuit path and said second circuit path is generated as a sampled output of said sampling circuit, said noise signal being substantially absent in said sampled output due to said difference.

5. The sampling circuit of claim 4, wherein said first circuit path comprises a first switched capacitor circuit.

6. The sampling circuit of claim 5, wherein said second circuit path comprises:
a high pass filter providing high frequency components in said input signal as a first output; and
a second switched capacitor circuit coupled to said high pass filter sampling said first output.

7. The sampling circuit of claim 6, wherein said high pass filter comprises:
a first capacitor receiving said input signal on one terminal and a second terminal of said first capacitor being connected to a first node; and
a resistor connected between said first node and a second node.

8. The sampling circuit of claim 7, wherein said second circuit path further comprises:
a first switch connected between said second node and a common mode voltage; and
a second switch connected across said first capacitor.

9. The sampling circuit of claim 7, wherein said second switched capacitor circuit comprises:
a second capacitor connected between a third node and a fourth node;
a third switch connected between a fifth node and said third node; and
a fourth switch connected between said fourth node and said common mode voltage.

10. The sampling circuit of claim 9, wherein said second circuit path further comprises a buffer connected between said first node and said fifth node.

11. The sampling circuit of claim 10, wherein said sampling circuit is comprised in a correlated double sampler (CDS) which receives a reference level in a first phase and a relative video level in a second phase, said CDS generating actual video level representing a pixel as a difference of said reference level and said relative video level.

12. The sampling circuit of claim 11, further comprising:
a third circuit path implemented similar to said second circuit path, wherein said first circuit path samples said reference level along with a corresponding noise signal in said first phase and said relative video level along with a corresponding noise signal in said second phase,
said second circuit path sampling high frequency components corresponding to said reference level in said first phase and said third circuit path sampling high frequency components corresponding to said relative video level in said second phase;
an amplifier amplifying the difference of outputs of said first circuit path received on a first input and said second circuit path received on a second input at the end of said second phase;
a third capacitor connected between a first output of said amplifier and said first input of said amplifier forming a first feedback path in said second phase;
a fourth capacitor connected between a second output of said amplifier and said second input of said amplifier forming a second feedback path in said second phase, wherein the difference of outputs provided between said first output and said second output represents said actual video level.

13. A device comprising:
a sampling circuit to sample an input signal comprising a source signal and a noise signal of high frequency components, said sampling circuit comprising:
a first circuit portion receiving said input signal, said first circuit portion generating an output signal by limiting bandwidth of said input signal, wherein said noise signal being substantially absent in said output signal due to said limiting; and
a second circuit portion sampling said output signal generated by said first circuit portion,
wherein said device captures an image in a digital form, said device comprises:
an image sensor allowing a light corresponding to said image to be incident on said image sensor, wherein said image sensor generating an electrical signal proportionate to the intensity of incident light; and
an analog front end (AFE) processing said electrical signal, said AFE comprising said sampling circuit, said input signal being generated based on said electrical signal,
wherein said first circuit portion comprises a low pass filter,
wherein said second circuit portion is implemented as a switched capacitor circuit,
wherein said low pass filter comprises:
a resistor receiving said source signal on one terminal and other terminal of said resistor being connected to a first node; and
a first capacitor connected between said first node and a second node,
wherein said first circuit portion further comprises:
a first switch connected between said second node and a common mode voltage; and
a second switch connected across said first capacitor, and
wherein said second circuit portion comprises:
a buffer being coupled to receive an input from said first node;
a second capacitor connected between a third node and a fourth node;
a third switch connected between an output of said buffer and said third node; and
a fourth switch connected between said fourth node and said common mode voltage.

14. The device of claim 13, wherein said sampling circuit is implemented without requiring a bandwidth limiting element in signal path.

15. The device of claim 14, wherein said second circuit portion and said first circuit portion are implemented using a separate set of components.

16. The device of claim 13, wherein said image sensor contains a plurality of pixels, wherein each of said plurality of pixels stores a charge proportionate to the intensity of incident light and said image sensor generating said input signal proportionate to said charge.

17. The device of claim 13, wherein said AFE further comprises:
a programmable gain amplifier (PGA) amplifying an output of said sampling circuit to generate an amplified sampled signal; and
an analog to digital converter (ADC) converting said amplified sampled signal to digital values representing said image.

18. The device of claim 17, said device further comprises:
a processor processing said digital values; and
a memory storing said digital values.

19. The device of claim 18, wherein said image sensor comprises a charge coupled device (CCD).

20. A device comprising:
a sampling circuit to sample an input signal containing a source signal and a noise signal of high frequency components, said sampling circuit comprising:
a first circuit path sampling said input signal; and
a second circuit path sampling high frequency components of said input signal, wherein a difference of outputs of said first circuit path and said second circuit path is generated as a sampled output of said sampling circuit, said noise signal being substantially absent in said sampled output due to said difference.

21. The device of claim 19, wherein said device captures an image in a digital form, said device comprises:
an image sensor allowing a light corresponding to said image to be incident on said image sensor, wherein said image sensor generating an electrical signal proportionate to the intensity of incident light; and
an analog front end (AFE) processing said electrical signal, said AFE comprising said sampling circuit, said input signal being generated based on said electrical signal.

22. The device of claim 21, wherein said first circuit path comprises a first switched capacitor circuit.

23. The device of claim 22, wherein said second circuit path comprises:
a high pass filter providing high frequency components in said input signal as a first output; and
a second switched capacitor circuit coupled to said high pass filter sampling said first output.

24. The device of claim 23, wherein said high pass filter comprises:
a first capacitor receiving said input signal on one terminal and a second terminal of said first capacitor being connected to a first node; and
a resistor connected between said first node and a second node.

25. The device of claim 24, wherein said second circuit path further comprises:
a first switch connected between said second node and a common mode voltage; and
a second switch connected across said first capacitor.

26. The device of claim 24, wherein said second switched capacitor circuit comprises:
a second capacitor connected between a third node and a fourth node;
a third switch connected between a fifth node and said third node; and
a fourth switch connected between said fourth node and said common mode voltage.

27. The device of claim 26, wherein said second circuit path further comprises a buffer connected between said first node and said fifth node.

28. The device of claim 20, wherein said image sensor contains a plurality of pixels, wherein each of said plurality of pixels stores a charge proportionate to the intensity of incident light and said image sensor generating said input signal proportionate to said charge.

29. The device of claim 27, wherein said AFE further comprises:
a programmable gain amplifier (PGA) amplifying an output of said sampling circuit to generate an amplified sampled signal; and
an analog to digital converter (ADC) converting said amplified sampled signal to digital values representing said image.

30. The device of claim 29, said device further comprises:
a processor processing said digital values; and
a memory storing said digital values.

31. The device of claim 29, wherein said image sensor comprises a charge coupled device (CCD).

32. The device of claim 31, wherein said sampling circuit is comprised in a correlated double sampler (CDS) which receives a reference level in a first phase and a relative video level in a second phase, said CDS generating actual video level representing a pixel as a difference of said reference level and said relative video level.

33. The device of claim 32, further comprising:
a third circuit path implemented similar to said second circuit path, wherein said first circuit path samples said reference level along with a corresponding noise signal in said first phase and said relative video level along with a corresponding noise signal in said second phase, said second circuit path sampling high frequency components corresponding to said reference level in said first phase and said third circuit path sampling high frequency components corresponding to said relative video level in said second phase;
an amplifier amplifying the difference of outputs of said first circuit path received on a first input and said second circuit path received on a second input at the end of said second phase;
a third capacitor connected between a first output of said amplifier and said first input of said amplifier forming a first feedback path in said second phase;
a fourth capacitor connected between a second output of said amplifier and second input of said amplifier forming a second feedback path in said second phase, wherein the difference of outputs provided between said first output and said second output represents said actual video level.

34. A sampling circuit to sample a source signal received on an input path, a noise signal of high frequency components also being received on said input path, said sampling circuit comprising:

means for sampling an input signal generates a first output, wherein said input signal contains both of said source signal and said noise signal; and means for sampling high frequency components of said input signal generates a second output, wherein a difference of said first output and said second output is generated as a sampled output, said noise signal being substantially absent in said sampled output due to said difference.

35. The sampling circuit of claim 34, wherein said means for sampling an input signal passes said input signal through a first switched capacitor circuit.

36. The sampling circuit of claim 35, wherein said means for sampling high frequency components is operable to:

pass said input signal through a high pass filter to provide high frequency components in said input signal as a third output; and pass said third output through a second switched capacitor circuit to generate said second output.

37. A method of sampling a source signal received on an input path, a noise signal of high frequency components also being received on said input path, said method comprising:

sampling an input signal to generate a first output, wherein said input signal contains both of said source signal and said noise signal; and sampling high frequency components of said input signal to generate a second output, wherein a difference of said first output and said second output is generated as a sampled output, said noise signal being substantially absent in said sampled output due to said difference.

38. The method of claim 37, wherein said sampling an input signal comprises passing said input signal through a first switched capacitor circuit.

39. The method of claim 38, wherein said sampling high frequency components comprises:

passing said input signal through a high pass filter to provide high frequency components in said input signal as a third output; and passing said third output through a second switched capacitor circuit to generate said second output.

* * * * *